United States Patent [19]

Adachi et al.

[11] Patent Number: 5,462,921
[45] Date of Patent: Oct. 31, 1995

[54] METHOD OF FORMING HG-CONTAINING OXIDE SUPERCONDUCTING FILMS

[75] Inventors: Hideaki Adachi; Kentaro Setsune, both of Osaka; Koichi Mizuno, Nara, all of Japan

[73] Assignee: Matsushita Electric Industrial Co., Ltd., Japan

[21] Appl. No.: 239,963

[22] Filed: May 9, 1994

[30] Foreign Application Priority Data

May 14, 1993 [JP] Japan .................................. 5-112848
Oct. 15, 1993 [JP] Japan .................................. 5-258163
Dec. 16, 1993 [JP] Japan .................................. 5-316191

[51] Int. Cl.⁶ ..................................................... B05D 5/12
[52] U.S. Cl. ........................ 505/473; 505/470; 505/475; 505/474; 505/500; 505/742; 505/125; 427/62; 427/343; 204/192.24
[58] Field of Search ..................................... 505/110, 125, 505/785, 470, 473, 500, 475, 474, 742; 427/62, 343; 204/192.24

OTHER PUBLICATIONS

Adachi et al, Appl. Phys. lett. 63(26) Dec. 1993, pp. 3628–3629.
Ichikawa et al, Appl. Phys. lett. 53(10) Sep. 1988, pp. 919–921.
Face et al, Appl. Phys. lett. 61(15) Oct. 1992, pp. 1838–1840.
Nature, 6 May 1993, UK, vol. 363, No. 6424, pp. 56–58, Schilling A et al 'Superconductivity above 130 K in the Hg–Ba–Ca–Cu–O system'.
Physica C, 10 Mar. 1994, Netherlands, vol. 222, No. 1–2, pp. 33–37, Isawa K et al 'Encapsulation method for the synthesis of nearly single-phase superconducting HgBa2Ca2Cu3O8+ delta with Tc>or =135 K'.
Physica C, 10 Mar. 1994, Netherlands, vol. 222, No. 1–2, pp. 7–12, Paranthaman M 'Single-step systhesis of bulk HgBa2Ca2Cu3O8+delta'.

*Primary Examiner*—Roy V. King
*Attorney, Agent, or Firm*—Parkhurst, Wendel & Rossi

[57] ABSTRACT

A method of fabricating a thin-film Hg-containing oxide superconductor is disclosed, which comprises forming a thin film on a substrate, said thin film containing mercury, an alkaline earth element, and copper as main components thereof; and subjecting said substrate with the thin film to a heat treatment in an oxygen-containing atmosphere at an oxygen partial pressure of $\frac{1}{500}$ to $\frac{1}{10}$ atm, to convert said thin film to the thin-film superconductor.

10 Claims, 3 Drawing Sheets

METHOD OF FORMING HG-CONTAINING OXIDE SUPERCONDUCTING FILMS

BACKGROUND OF THE INVENTION

1. Field of the Invention

This invention generally relates to a superconductor and a method of fabricating a superconductor. This invention specifically relates to a copper oxide superconductor. This invention also relates to a thin-film superconductor.

2. Description of the Prior Art

J. G. Bednorz and K. A. Muller discovered a high-Tc superconductor including a perovskite oxide compound of the Ba—La—Cu—O system (J. G. Bednorz and K. A. Muller: Zeitshrift Fur Physik B, Condensed Matter, Vol. 64, 189–193, 1986). After the discovery by J. G. Bednorz and K. A. Muller, other perovskite oxide superconductors have also been discovered which have various chemical compositions.

S. N. Putilin et al discovered that a mercury-bearing perovskite oxide compound of $HgBa_2CuO_{4+\delta}$ was superconducting below a temperature of 94 K. (S. N. Putilin et al: Nature, Vol. 362, p. 226, 1993). This superconducting oxide compound is thought to be of a crystal structure in which perovskite $Ba_2CuO_4$ layers containing $CuO_6$ octahedrons are separated by 1-atom layers mainly containing mercury atoms. It should be noted that 1-atom layers mean layers having thicknesses corresponding to one atom.

When the $HgBa_2CuO_{4+\delta}$ superconductor is practically used and operated as a superconductor at the liquid nitrogen temperature (77 K.), its superconducting transition temperature Tc being 94 K. is close to the lower limit of a usable transition temperature range in consideration of a necessary temperature margin. Accordingly, superconducting transition temperatures Tc higher than 94 K. are desirable for sure use and operation of superconductors at the liquid nitrogen temperature.

Since a mercury vapor pressure is very high, mercury-containing oxide compounds are generally made in a sealed container where oxygen gas and mercury vapor are held in pressurized states. Such methods of making mercury-containing oxide compounds are complicated, and thus have a problem in industrial application thereof.

Available $HgBa_2CuO_{4+\delta}$ superconductors are only in the form of ceramics. One reason for this fact is that a mercury vapor pressure is very high. Generally, thin-film configurations of superconductors are desirable for their applications to electronic devices. Accordingly, thin-films of $HgBa_2CuO_{4+\delta}$ superconductors have been desired.

Furthermore, regarding applications of thin-film oxide superconductors to electronic devices, each of the superconductors is sometimes required to be made of a single crystal without grain boundaries. Some cases require a laminate of a thin-film oxide superconductor and a layer of other material. To meet such requirements, it has been desired to realize "in-situ growth" where a thin film is formed on a heated substrate, and the thin film is provided with a crystal structure upon the formation thereof as in the fabrication of known $YBa_2Cu_3O_7$ superconductors.

SUMMARY OF THE INVENTION

It is an object of this invention to provide a new useful superconductor.

It is another object of this invention to provide a new useful method of fabricating a superconductor.

A first aspect of this invention provides a superconductor comprising an oxide of $HgA_{n+3}Cu_{n+2}O_{2n+6+x}$, where "A" denotes alkaline earth element and "n" denotes an integer equal to or greater than 0, and "x" denotes a value in a range as $-1<x<1$; said oxide having a crystal structure comprising a 1-atom layer mainly containing Hg, and an oxygen-deficient perovskite layer of $A_{n+3}Cu_{n+2}O_{2n+6}$; said perovskite layer comprising two layers of $CuO_5$ pyramids which are opposite to each other, "n" $CuO_2$ layers extending between said two pyramid layers, and 1-atom layers of said alkaline earth element A.

A second aspect of this invention provides a method of fabricating a superconductor which comprises the steps of making a material containing mercury, alkaline earth element, and copper as main components thereof; and subjecting said material to a heat treatment in an atmosphere containing oxygen at a predetermined low concentration to change said material into a superconductor.

A third aspect of this invention provides a method of fabricating a thin-film superconductor which comprises the steps of forming a thin film on a substrate, said thin film containing mercury, alkaline earth element, and copper as main components thereof; and subjecting said substrate with the thin film to a heat treatment in an atmosphere containing oxygen at a predetermined low concentration to change said thin film into a thin-film superconductor.

A fourth aspect of this invention provides a method of fabricating a thin-film superconductor which comprises the steps of heating a substrate; and depositing a thin-film superconductor on the heated substrate in an atmosphere containing oxygen and another substance, wherein an oxygen partial pressure in the atmosphere is equal to or lower than 0.2 Pa, said thin film containing mercury, alkaline earth element, and copper as main components thereof.

DESCRIPTION OF THE PREFERRED EMBODIMENTS

Figure 1:
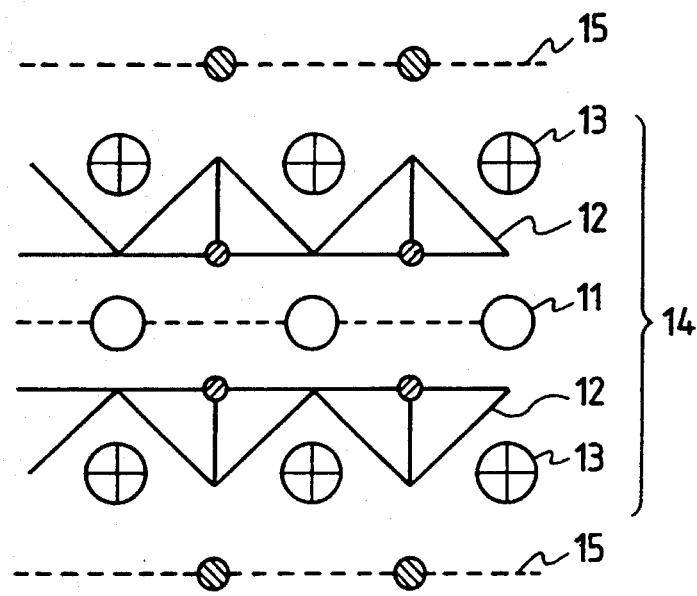
FIG. 1 is a diagram of the crystal structure of an $HgBa_2CaCu_2O_{6+x}$ thin-film superconductor according to an embodiment of this invention.

According to a first embodiment of this invention, a superconductor comprises an oxide of $HgA_{n+3}Cu_{n+2}O_{2n+6+x}$, where "A" denotes alkaline earth element and "n" denotes an integer equal to or greater than 0, and "x" denotes a value in a range as $-1<x<1$. The oxide has a crystal structure comprising a 1-atom layer mainly containing Hg, and an oxygen-deficient perovskite layer of $A_{n+3}Cu_{n+2}O_{2n+6}$. The perovskite layer comprises two layers of $CuO_5$ pyramids which are opposite to each other, "n" $CuO_2$ layers extending between the two pyramid layers, and 1-atom layers of the alkaline earth element A.

According to a second embodiment of this invention, a method of fabricating a superconductor comprises the steps of making a material containing mercury, alkaline earth element, and copper as main components thereof; and subjecting the material to a heat treatment in an atmosphere containing oxygen at a predetermined low concentration to change the material into a superconductor.

It is preferable that the predetermined oxygen concentration corresponds to an oxygen partial pressure in the atmosphere which is in a range of $1/500$ atm to $1/10$ atm.

It is preferable that the alkaline earth element comprises barium.

It is preferable that the subjecting step comprises heating the material at a temperature in a range of 650° C. to 700° C.

It is preferable that the subjecting step comprises increasing a temperature of the material at a rate equal to or greater than 500° C. per hour.

It is preferable to further provide the step of cooling the material at a rate equal to or greater than 500° C. per hour after the subjecting step.

According to a third embodiment of this invention, a method of fabricating a thin-film superconductor comprises the steps of forming a thin film on a substrate, the thin film containing mercury, alkaline earth element, and copper as main components thereof; and subjecting the substrate with the thin film to a heat treatment in an atmosphere containing oxygen at a predetermined low concentration to change the thin film into a thin-film superconductor.

It is preferable that the predetermined oxygen concentration corresponds to an oxygen partial pressure in the atmosphere which is in a range of $1/500$ atm to $1/10$ atm.

It is preferable that the alkaline earth element comprises barium.

It is preferable that the subjecting step comprises heating the substrate with the thin film at a temperature in a range of 650° C. to 700° C.

It is preferable that the subjecting step comprises increasing a temperature of the substrate with the thin film at a rate equal to or greater than 500° C. per hour.

It is preferable to further provide the step of cooling the substrate with the thin film at a rate equal to or greater than 500° C. per hour after the subjecting step.

According to a fourth embodiment of this invention, a method of fabricating a thin-film superconductor comprises the steps of heating a substrate; and depositing a thin-film superconductor on the heated substrate in an atmosphere containing oxygen and another substance, wherein an oxygen partial pressure in the atmosphere is equal to or lower than 0.2 Pa, the thin film containing mercury, alkaline earth element, and copper as main components thereof.

EXAMPLE 1

A thin film of Hg—Ba—Ca—Cu—O was deposited on a (100) plane of an MgO single-crystal substrate by an RF magnetron sputtering process. The deposited thin-film had a thickness of 1 μm. Before the start of the sputtering process, a sputtering target was prepared as follows. Powder of $Ba_2CuO_3$, powder of $Ca_2CuO_3$, powder of CuO, and powder of HgO were mixed at a composition molar ratio among metal elements which was expressed as Hg:Ba:Ca:Cu= 2:2:1:2. The resultant mixture was shaped into a disk forming a sputtering target. The sputtering process was executed in an argon atmosphere while the sputtering target was used. During the deposition of the thin film by the sputtering process, the pressure of the argon atmosphere was equal to 3 Pa, and the RF power was equal to 50 W.

In the case where the temperature was set to a room temperature during the deposition of the thin film, the resultant thin-film was amorphous and had a composition corresponding a metal-element molar ratio expressed as Hg:Ba:Ca:Cu=2.5:2:0.7:1.7.

After the thin film was subjected to a heat treatment, the characteristics of the thin film were experimentally evaluated. Before the start of the heat treatment, the substrate with the thin film was placed into a glass capsule. During the heat treatment, the substrate with the thin film was heated by an infrared lamp while being in a flow of nitrogen-based gas containing 10% oxygen within the capsule.

In the case where the substrate with the thin film was heated at a temperature of 650° C. for 20 minutes during the heat treatment, the resultant thin-film had a composition corresponding to a metal-element molar ratio expressed as Hg:Ba:Ca:Cu=0.8:2:0.4:1.5. The resultant thin-film was oriented along an axis, and had a unit axis length of 9.5 Å.

The resultant thin-film was experimentally analyzed in detail. It was found from the result of the analysis that the resultant thin-film was made of a c-axis oriented $Hg(Ba_{1-z}Ca_z)_2CuO_{4+x}$ compound ($-1<x<1$, and "z" denotes an atomic fraction of Ca relative to Ba). The $Hg(Ba_{1-z}Ca_z)_2CuO_{4+x}$ compound had a crystal structure similar to that of an $HgBa_2CuO_4+\delta$ compound. Accordingly, in the crystal structure of the $Hg(Ba_{1-z}Ca_z)_2CuO_{4+x}$ compound, perovskite layers containing $CuO_6$ octahedrons were separated by 1-atom layers mainly containing mercury atoms. It should be noted that 1-atom layers mean layers having thicknesses corresponding to one atom.

The electric resistivity of the $Hg(Ba_{1-z}Ca_z)_2CuO_{4+x}$ thin-film was equal to 1 mΩcm at a room temperature. The resistance of the $Hg(Ba_{1-z}Ca_z)_2CuO_{4+x}$ thin-film dropped at a temperature of 90 K. due to a superconducting transition.

In the case where the substrate with the thin film was heated at a temperature of 620° C. for 20 minutes during the heat treatment, the resultant thin-film had a composition corresponding to a metal-element molar ratio expressed as Hg:Ba:Ca:Cu=1:2:0.8:1.7. The resultant thin-film was oriented along an axis, and had a unit axis length of 12.7 Å.

The resultant thin-film was experimentally analyzed in detail. It was found from the result of the analysis that the resultant thin-film was made of a c-axis oriented $HgBa_2CaCu_2O_{6+x}$ compound ($-1<x<1$). The $HgBa_2CaCu_2O_{6+x}$ compound had the following crystal structure. As shown in FIG. 1, the crystal structure of the $HgBa_2CaCu_2O_{6+x}$ compound had oxygen-deficient perovskite layers 14 separated by 1-atom layers 15 mainly containing mercury atoms. Each perovskite layer 14 had two opposite layers 12 of $CuO_5$ pyramids, a 1-atom layer 11 of Ca atoms extending between the pyramid layers 12, and two 1-atom layers 13 of Ba atoms extending above and below the pyramid layers 12.

The resistance of the $HgBa_2CaCu_2O_{6+x}$ thin-film dropped at a temperature of 102 K. due to a superconducting transition. Thus, it was confirmed that the $HgBa_2CaCu_2O_{6+x}$ compound was a new superconductor.

It was preferable that, during the heat treatment, ceramic pellet or powder of a compound containing mercury was placed together with the combination of the substrate and the thin film in the capsule. It was confirmed that the pellet or powder suppressed the vaporization of mercury from the thin film and caused an increased repeatability of the fabrication of the superconductor.

It was preferable that, during an initial stage of the heat treatment, the temperature of the substrate with the thin film was increased at a rate equal to or higher than 500° C. per hour. It was preferable that the substrate with the thin film was cooled at a rate equal to or higher than 500° C. per hour after the heat treatment. It was confirmed that such rapid heating and cooling enabled better superconducting characteristics of the thin film.

It should be noted that at least one of Ba and Ca may be replaced by other alkaline earth elements. In other words, a combination of Ba and Ca may be replaced by another combination of alkaline earth elements.

EXAMPLE 2

A thin film of Hg—Ba—Ca—Cu—O was deposited on a (100) plane of an MgO single-crystal substrate by an RF magnetron sputtering process. The deposited thin-film had a thickness of, for example, 1 μm. Before the start of the sputtering process, a sputtering target was prepared as follows. Powder of $Ba_2CuO_3$, powder of $Ca_2CuO_3$, powder of CuO, and powder of HgO were mixed at a composition molar ratio among metal elements which was expressed as Hg:Ba:Ca:Cu=2:2:2.2:3.2. The resultant mixture was shaped into a disk forming a sputtering target. The sputtering process was executed in an argon atmosphere while the sputtering target was used. During the deposition of the thin film by the sputtering process, the pressure of the argon atmosphere was equal to a predetermined value (for example, 3 Pa), and the RF power was equal to a predetermined value (for example, 50 W).

After the thin film was subjected to a heat treatment, the characteristics of the thin film were experimentally evaluated. Before the start of the heat treatment, the substrate with the thin film was placed into a glass capsule. During the heat treatment, the substrate with the thin film was heated by an infrared lamp while being in a flow of nitrogen-based gas containing 10% oxygen within the capsule.

In the case where the substrate with the thin film was heated at a temperature of 620° C. for 20 minutes during the heat treatment, the resultant thin-film had a composition corresponding to a metal-element molar ratio expressed as Hg:Ba:Ca:Cu=1:2:2:3. The resultant thin-film was oriented along an axis, and had a unit axis length of 15.9 Å.

Figure 2:
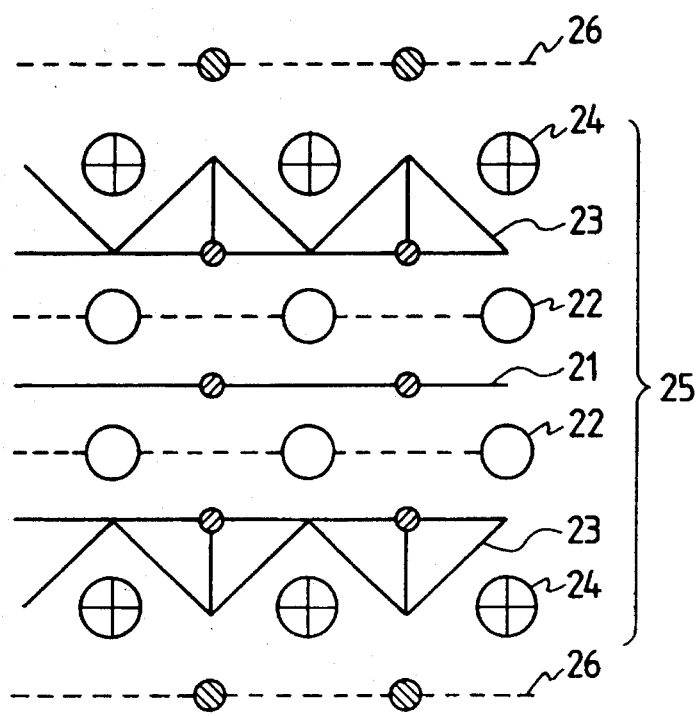
FIG. 2 is a diagram of the crystal structure of an $HgBa_2Ca_2Cu_3O_{8+x}$ thin-film superconductor according to an embodiment of this invention.

The resultant thin-film was experimentally analyzed in detail. It was found from the result of the analysis that the resultant thin-film was made of a c-axis oriented $HgBa_2Ca_2Cu_3O_{8+x}$ compound $(-1<x<1)$. The $HgBa_2Ca_2Cu_3O_{8+x}$ compound had the following crystal structure. As shown in FIG. 2, the crystal structure of the $HgBa_2Ca_2Cu_3O_{8+x}$ compound had oxygen-deficient perovskite layers 25 separated by 1-atom layers 26 mainly containing mercury atoms. Each perovskite layer 25 had two opposite layers 23 of $CuO_5$ pyramids, two 1-atom layers 22 of Ca atoms extending between the pyramid layers 23, a layer 21 of $CuO_2$ extending between the 1-atom layers 22, and two 1-atom layers 24 of Ba atoms extending above and below the pyramid layers 23.

The resistance of the $HgBa_2Ca_2Cu_3O_{8+x}$ thin-film dropped at a temperature of 105 K. due to a superconducting transition. Thus, it was confirmed that the $HgBa_2Ca_2Cu_3O_{8+x}$ compound was a new superconductor.

It should be noted that the composition of the thin film may be modified to additionally have a small amount of lead (Pb) or other metal elements.

EXAMPLE 3

A thin film of Hg—Ba—Cu—O was deposited on a (100) plane of an $SrTiO_3$ single-crystal substrate by an RF magnetron sputtering process. The deposited thin-film had a thickness of 5,000 Å. Before the start of the sputtering process, a sputtering target was prepared as follows. Powder of $Ba_2CuO_3$ and powder of HgO were mixed at a composition molar ratio among metal elements which was expressed as Hg:Ba:Cu=2.5:2:1. The resultant mixture was shaped into a disk forming a sputtering target. The sputtering process was executed in an argon atmosphere while the sputtering target was used. During the deposition of the thin film by the sputtering process, the pressure of the argon atmosphere was equal to 0.5 Pa.

In the case where the temperature of the substrate was set to a room temperature during the deposition of the thin film, the resultant thin-film was amorphous and had a composition corresponding to a metal-element molar ratio expressed as Hg:Ba:Cu=1−y:2:1+y ($0 \leq y \leq 0.7$, and "y" denotes a value depending on the conditions of the fabrication of the thin film).

After the thin film was subjected to a heat treatment in various conditions, the characteristics of the thin film were experimentally evaluated. Before the start of the heat treatment, the substrate with the thin film was placed into a glass capsule. During the heat treatment, the substrate with the thin film was heated by an infrared lamp while being in an atmosphere of nitrogen-based gas containing 1% oxygen within the capsule.

It should be noted that the capsule may be omitted. In this case, the heat treatment is executed without using the capsule.

In the case where the substrate with the thin film was heated at a temperature of 600° C. to 750° C., the thin film was crystallized into an $HgBa_2CuO_{4+x}$ superconducting compound. In the case where the substrate with the thin film was heated at a temperature equal to or higher than 750° C., mercury left the thin film so that it was difficult to crystallize the thin film into a single crystal of superconductor. To provide a good thin-film $HgBa_2CuO_{4+x}$ superconductor, it was preferable that the substrate with the thin film was heated at a temperature of 650° C. to 700° C.

It was preferable that, during an initial stage of the heat treatment, the temperature of the substrate with the thin film was increased at a rate equal to or higher than 500° C. per hour. It was preferable that the substrate with the thin film was cooled at a rate equal to or higher than 500° C. per hour after the heat treatment. It was confirmed that such rapid heating and cooling enabled better superconducting characteristics and crystallinity of the thin film.

Figure 3:
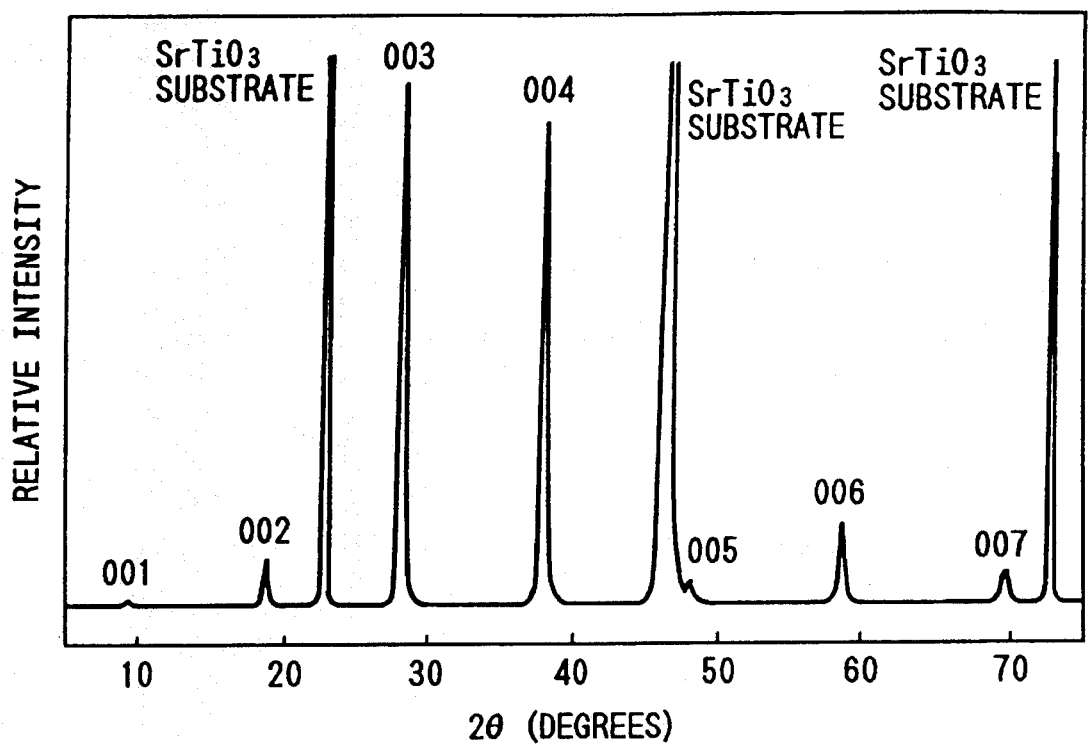
FIG. 3 is a diagram of an x-ray diffraction pattern of an $HgBa_2CuO_{4+x}$ thin-film superconductor according to an embodiment of this invention.

In the case where the substrate with the thin film was heated at a temperature of 670° C. for 45 minutes during the heat treatment, the resultant thin-film had a good crystallinity. FIG. 3 shows an x-ray diffraction pattern of the resultant thin-film. It was found from FIG. 3 that the resultant thin-film was c-axis oriented, and had a unit axis length of 9.5 Å.

Figure 4:
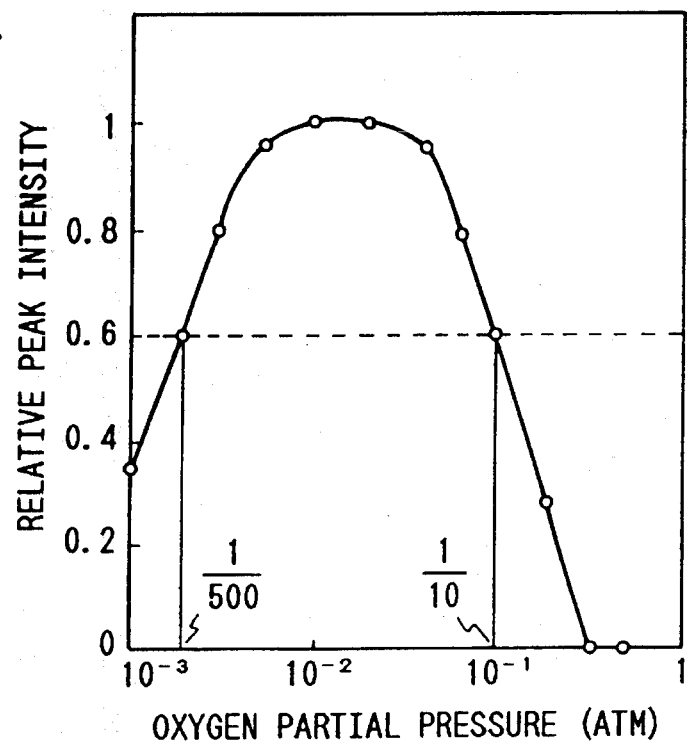
FIG. 4 is a diagram of the relation between a relative x-ray peak intensity and an oxygen partial pressure regarding Hg—Ba—Cu—O thin films.

Samples of the thin film were made while the oxygen concentration in the nitrogen-based atmosphere for the heat treatment was varied. The samples were experimentally analyzed. It was found from the result of the analysis that the crystallinity of the resultant thin-film depended on the oxygen concentration in the nitrogen-based atmosphere for the heat treatment. Specifically, samples of the thin film were made under various conditions of the heat treatment where the substrate with the thin film was heated at a temperature of 670° C. for 45 minutes and the oxygen concentration in the nitrogen-based atmosphere was varied from 0% to 50%. Measurement was given of the intensity of the x-ray at the (004) peak in an x-ray diffraction pattern of each of the samples of the thin film. FIG. 4 shows the relation between the relative peak intensity and the oxygen partial pressure corresponding to the oxygen concentration in the nitrogen-based atmosphere. It was found from FIG. 4 that a thin film with a good crystallinity was made when the oxygen partial pressure was in the range of $1/500$ atm to $1/10$ atm. Accordingly, it was preferable that the oxygen partial pressure was in the range of $1/500$ atm to $1/10$ atm.

It was experimentally confirmed that the thin film which was made under the above-indicated preferable conditions of the oxygen partial pressure had a superconducting transition temperature of 90 K. or higher.

It was preferable that the thin film was subjected to a second heat treatment in oxygen gas. Specifically, during the second heat treatment, the thin film was heated at a temperature of about 300° C. to about 500° C. It was confirmed that the second heat treatment provided a better repeatability regarding the superconducting characteristics of the thin film.

It should be noted that Ba may be replaced by another alkaline earth element or a combination of alkaline earth elements. In addition, the nitrogen-based gas for the heat treatment may be replaced by another oxygen-containing gas such as a mixture of inert gas and oxygen gas. An example of the inert gas is argon gas.

EXAMPLE 4

A thin film of $HgBa_2CuO_{4+x}$ superconductor was fabricated by "in-situ growth" as follows. A sputtering target was prepared. Specifically, powder of $Ba_2CuO_3$ and powder of HgO were mixed at a composition molar ratio among metal elements which was expressed as Hg:Ba:Cu=2.5:2:1. A thin film of $HgBa_2CuO_{4+x}$ superconductor was deposited on a (100) plane of an $SrTiO_3$ single-crystal substrate by a sputtering process using plasma discharge. While the sputtering target was used, the sputtering process was executed in a mixture (a sputtering gas) of argon gas and oxygen gas which had a pressure of $1/10$ atm or lower. During the sputtering process, the substrate remained heated.

Figure 5:
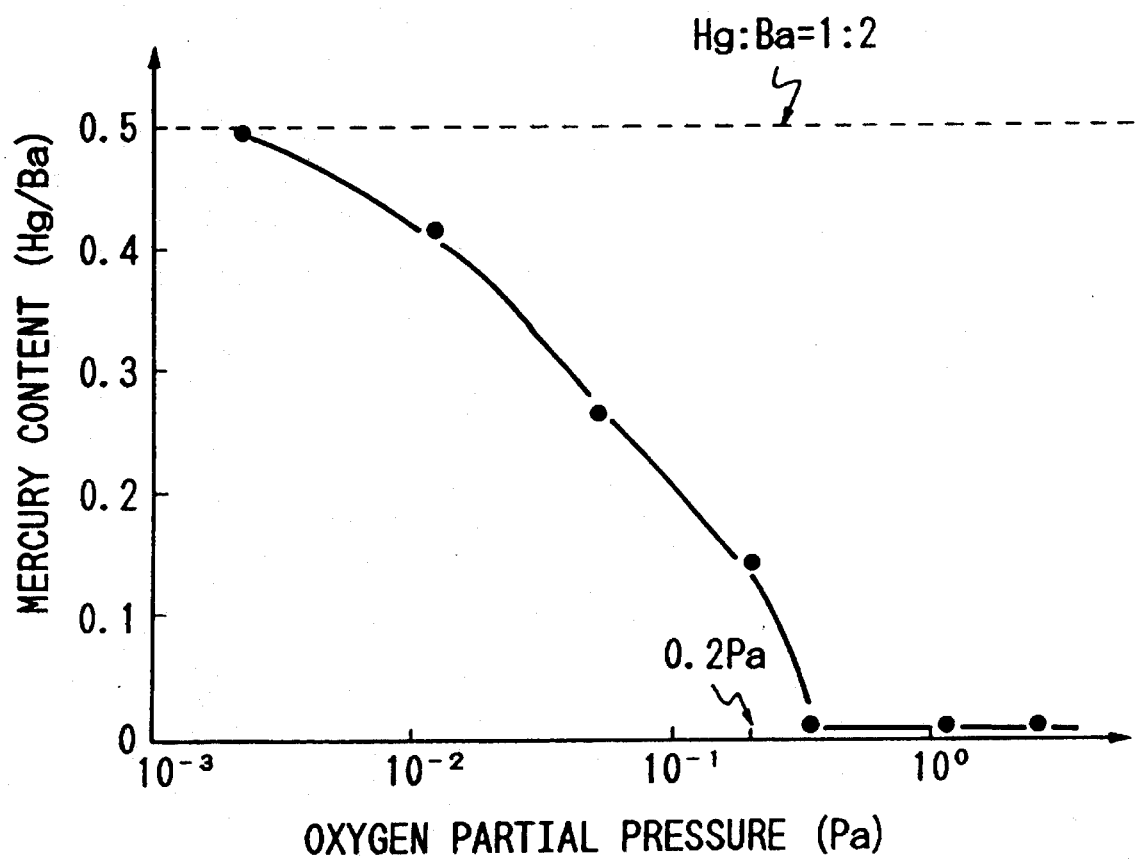
FIG. 5 is a diagram of the relation between a mercury content of an Hg—Ba—Cu—O thin film and an oxygen partial pressure in a sputtering gas.

Samples of the thin film were made while the temperature of the substrate and the oxygen concentration in the sputtering gas were varied. The samples were experimentally analyzed. FIG. 5 shows the relation between the mercury content of the thin film relative to barium (that is, the Hg/Ba molar ratio) and the oxygen partial pressure in the sputtering gas regarding the thin film deposited at a substrate temperature of 550° C. As shown in FIG. 5, although the substrate was heated, Hg was introduced into the thin film when the oxygen partial pressure was equal to 0.2 Pa or lower. It was found that the thin film into which Hg was introduced had a crystal structure equal to the crystal structure of $HgBa_2CuO_{4+x}$ superconductor. The resultant superconducting thin-film had a composition corresponding to a metal-element molar ratio exactly expressed as Hg:Ba:Cu=1−w:2:1+w ($0 \leq w \leq 0.7$). It is thought that Hg atom deficiencies are compensated by Cu atoms. It was found that the c-axis of the crystal of $HgBa_2CuO_{4+x}$ superconductor in the thin film was oriented vertically or perpendicularly with respect to the surface of the substrate. Furthermore, the thin film was grown substantially as a single crystal according to the crystal orientation of the $SrTiO_3$ substrate, and crystal grain boundaries were hardly present therein.

The superconducting crystal structure appeared in the thin film which was grown at a substrate temperature of 400° C. to 650° C. It was confined that, when the thin film was grown at a substrate temperature of 650° C. or higher, mercury vaporized from the thin film and was not introduced into the resultant thin-film. The substrate temperature was preferably in the range of 500° C. to 600° C.

It was experimentally confirmed that the thin film which was made under the above-indicated preferable conditions of the substrate temperature had a superconducting transition temperature of 90 K. or higher.

It was preferable that the thin film made by "in-situ growth" was subjected to a heat treatment in oxygen gas. Specifically, during the heat treatment, the thin film was heated at a temperature of about 500° C. It was confirmed that the heat treatment provided a better repeatability regarding the superconducting characteristics of the thin film. The thin film subjected to the heat treatment had a critical current density of a hundred thousand of $A/cm^2$ at the liquid nitrogen temperature (77 K.).

It should be noted that the plasma-discharge sputtering process may be replaced by an ion-beam sputtering process or a laser sputtering process. Furthermore, a general thin-film fabricating technology may be used which differs from a sputtering process such as a reactive vapor deposition process. Regarding a thin film made by the general thin-film fabricating technology, the mercury content of the thin film and the oxygen partial pressure are thought to be in a relation which is similar to the previously-indicated relation. It should be noted that Ba may be replaced by another alkaline earth element or a combination of alkaline earth elements such as Sr and Ca.

What is claimed is:

1. A method of fabricating a thin-film superconductor, comprising the steps of:
    forming a thin film on a substrate, said thin film containing mercury, an alkaline earth element, and copper as main components thereof; and
    subjecting said substrate with the thin film to a heat treatment in an atmosphere containing oxygen at a concentration corresponding to an oxygen partial pressure of $1/500$ to $1/10$ atm, to change said thin film into the thin-film superconductor.

2. The method of claim 1, wherein said alkaline earth element comprises barium.

3. The method of claim 1, wherein said subjecting step comprises heating the substrate with the thin film at a temperature in a range of 650° C. to 700° C.

4. A method of fabricating a thin film superconductor, comprising the steps of:
    forming a thin film on a substrate, said thin film containing mercury, an alkaline earth element, and copper as main components thereof; and
    subjecting said substrate with the thin film to a heat treatment in an atmosphere containing oxygen at a concentration corresponding to an oxygen partial pressure of $1/500$ to $1/10$ atm, to change said thin film into the thin-film superconductor, wherein said subjecting step comprises increasing a temperature of the substrate with the thin film at a rate equal to or greater than 500° C. per hour.

5. A method of fabricating a thin film superconductor, comprising the steps of:

forming a thin film on a substrate, said thin film containing mercury, an alkaline earth element, and copper as main components thereof; and subjecting said substrate with the thin film to a heat treatment in an atmosphere containing oxygen at a concentration corresponding to an oxygen partial pressure of $1/500$ to $1/10$ atm, to change said thin film into the thin-film superconductor, further comprising the step of cooling the substrate with the thin film at a rate equal to or greater than 500° C. per hour after said subjecting step.

6. A method of fabricating a thin-film superconductor, comprising the steps of:

heating a substrate; and vapor-depositing a thin-film superconductor on the heated substrate in an atmosphere containing oxygen and another substance, wherein an oxygen partial pressure in the atmosphere is equal to or lower than 0.2 Pa, said thin film containing mercury, an alkaline earth element, and copper as main components thereof.

7. The method of claim 1, wherein the substrate with the thin film is heated together with a compound containing mercury during said subjecting step.

8. The method of claim 7, wherein said compound is contained in a powder.

9. The method of claim 7, wherein said compound is contained in a pellet.

10. A method of fabricating a thin-film superconductor, comprising the steps of:

forming a thin film on a substrate, said thin film containing mercury, an alkaline earth element, and copper as main components thereof; and subjecting said substrate with the thin film to a heat treatment in an atmosphere containing oxygen at a concentration corresponding to an oxygen partial pressure of $1/500$ to $1/10$ atm, to change said thin film into a thin-film superconductor comprising an oxide of $HgA_{n+3}Cu_{n+2}O_{2n+6+x}$, where A denotes an alkaline earth element and n denotes an integer equal to or greater than 0, and x denotes a value in a range of $-1 \leq x1$, said oxide having a crystal structure comprising a 1-atom layer mainly containing Hg, and an oxygen-deficient perovskite layer of $A_{n+3}Cu_{n+2}O_{2n+6}$, said perovskite layer comprising two layers of $CuO_5$ pyramids which are opposite to each other, n $CuO_2$ layers extending between said two pyramid layers, and at least one 1-atom layer of said alkaline earth element A.

* * * * *